US012796459B2

(12) United States Patent
Chen et al.

(10) Patent No.: US 12,796,459 B2
(45) Date of Patent: Nov. 10, 2026

(54) PACKAGE CARRIER PLATE WITH EMBEDDED EFFICIENT HEAT DISSIPATION MODULE AND MANUFACTURING METHOD THEREFOR

(71) Applicant: Zhuhai ACCESS Semiconductor Co., LTD., Zhuhai (CN)

(72) Inventors: Xianming Chen, Zhuhai (CN); Gao Huang, Zhuhai (CN); Benxia Huang, Zhuhai (CN); Zhijun Zhang, Zhuhai (CN)

(73) Assignee: ZHUHAI ACCESS SEMICONDUCTOR CO., LTD, Zhuhai (CN)

( * ) Notice: Subject to any disclaimer, the term of this patent is extended or adjusted under 35 U.S.C. 154(b) by 303 days.

(21) Appl. No.: 18/394,772

(22) Filed: Dec. 22, 2023

(65) Prior Publication Data

US 2024/0274491 A1 Aug. 15, 2024

(30) Foreign Application Priority Data

Feb. 10, 2023 (CN) ......................... 202310109554.4

(51) Int. Cl.
*H10W 40/22* (2026.01)
*H10W 70/05* (2026.01)
(Continued)

(52) U.S. Cl.
CPC ......... *H10W 40/22* (2026.01); *H10W 40/226* (2026.01); *H10W 70/05* (2026.01);
(Continued)

(58) Field of Classification Search
CPC ............................ H10W 40/735; H10W 40/73
See application file for complete search history.

(56) References Cited

U.S. PATENT DOCUMENTS

2016/0233145 A1* 8/2016 Caroff .................. H10W 40/22

FOREIGN PATENT DOCUMENTS

CN 101865370 A * 10/2010 .............. F21V 29/51
CN 101927426 A * 12/2010 ............ H10W 40/73
(Continued)

OTHER PUBLICATIONS

The State Intellectual Property Office of People's Republic of China. First Office Action for CN Application No. 2023101095544, mailed Jun. 11, 2026, pp. 1-7.
(Continued)

*Primary Examiner* — Evren Seven
(74) *Attorney, Agent, or Firm* — The Dobrusin Law, P.C.

(57) ABSTRACT

A package carrier plate with an embedded efficient heat dissipation module and a manufacturing method therefor are disclosed. The package carrier plate with an embedded efficient heat dissipation module includes: a metal carrier plate, in which a first opening frame is provided; and a metal heat dissipation module, where the metal heat dissipation module includes a first metal layer and a second metal layer, a plurality of copper walls arranged in parallel are connected between the first metal layer and the second metal layer, a phase change material is filled in a cavity formed between every two adjacent copper walls, the metal heat dissipation module is embedded in the first opening frame, and a first dielectric layer is filled in a gap between the metal heat dissipation module and an inner side wall of the first opening frame.

14 Claims, 4 Drawing Sheets

(51) Int. Cl.
*H10W 70/685* (2026.01)
*H10W 72/30* (2026.01)
*H10W 74/00* (2026.01)

(52) U.S. Cl.
CPC ........ *H10W 70/685* (2026.01); *H10W 72/321* (2026.01); *H10W 72/342* (2026.01); *H10W 72/352* (2026.01); *H10W 74/00* (2026.01)

(56) References Cited

FOREIGN PATENT DOCUMENTS

| | | | | | |
|---|---|---|---|---|---|
| CN | 103857264 | A | * | 6/2014 | ............ H05K 1/021 |
| CN | 111900141 | A | | 11/2020 | |
| CN | 114258183 | A | | 3/2022 | |
| JP | 2008311397 | A | * | 12/2008 | |
| JP | 2010206142 | A | | 9/2010 | |
| JP | 4880793 | B1 | | 2/2012 | |
| JP | 2019532492 | A | | 11/2019 | |
| JP | 2020020510 | A | | 2/2020 | |
| KR | 20090071386 | A | | 7/2009 | |
| KR | 20230007936 | A | | 1/2023 | |
| TW | 202412239 | A | | 3/2024 | |
| WO | 2020026860 | A1 | | 2/2020 | |
| WO | 2020184002 | A1 | | 9/2020 | |
| WO | 2022185522 | A1 | | 9/2022 | |

OTHER PUBLICATIONS

JP Patent Office, First Office Action for JP Application No. 2024-001158, mailed Dec. 24, 2024, pp. 1-6.

KR Patent Office, First Office Action for KR Application No. 10-2024-0000139, mailed May 16, 2025, pp. 1-6.

TW Patent Office, First Office Action for TW Application No. 112149725, mailed Nov. 8, 2024, pp. 1-5.

* cited by examiner

PACKAGE CARRIER PLATE WITH EMBEDDED EFFICIENT HEAT DISSIPATION MODULE AND MANUFACTURING METHOD THEREFOR

CROSS-REFERENCE TO RELATED APPLICATION

This application is based on and claims the benefit of priority from Chinese Patent Application No. 202310109554.4, filed on Feb. 10, 2023, the entirety of which is incorporated by reference herein.

TECHNICAL FIELD

The present disclosure relates to the technical field of semiconductor packaging structures, and in particular, to a package carrier plate with an embedded efficient heat dissipation module and a manufacturing method therefor.

BACKGROUND

At present, in the manufacturing process of a packaging substrate with an embedded device, a prefabricated opening frame plate is required, a chip is adhered to the opening frame, and then packaging is performed for build-up process.

The conventional opening frame is generally made of organic materials. Consequently, the heat dissipation performance of the package carrier plate with a multi-layer embedded chip cannot be guaranteed. In order to overcome this problem, the related technology proposes to provide a metal heat dissipation module in the opening frame, and fill a phase change material in the metal module, so as to improve the heat dissipation effect by using the characteristics of the phase change material that absorbs heat quickly and the metal that conducts heat quickly. However, the opening frames of different package carrier plates have different sizes. In order to ensure that the metal heat dissipation module can be embedded in different opening frames, a process size of the metal heat dissipation module needs to be adjusted for each product, resulting in low applicability and high manufacturing cost for the metal heat dissipation module.

SUMMARY

The present disclosure aims to at least solve one of the technical problems in the existing technology. Therefore, the present disclosure provides a package carrier plate with an embedded efficient heat dissipation module and a manufacturing method therefor, which can reduce the manufacturing cost while ensuring the heat dissipation effect.

In a first aspect, an embodiment of the present disclosure provides a package carrier plate with an embedded efficient heat dissipation module, comprising: a metal carrier plate, in which a first opening frame is provided; and a metal heat dissipation module, wherein the metal heat dissipation module comprises a first metal layer and a second metal layer, a plurality of copper walls arranged in parallel are connected between the first metal layer and the second metal layer, a phase change material is filled in a cavity formed between every two adjacent copper walls, the metal heat dissipation module is embedded in the first opening frame, and a first dielectric layer is filled in a gap between the metal heat dissipation module and an inner side wall of the first opening frame.

The package carrier plate with an embedded efficient heat dissipation module according to the embodiment of the present disclosure at least has the following beneficial effects. Firstly, a metal heat dissipation module is arranged in a first opening frame of a metal carrier plate, so that the characteristic of quick heat dissipation of metal can be used to improve the heat transfer effect and improve the internal heat dissipation efficiency of the package carrier plate. Secondly, a cavity is formed between the copper walls in the metal heat dissipation module, and a phase change material is filled in the cavity, so that the phase change material can be used to quickly absorb heat transferred by one of the first metal layer and the second metal layer and transfer the heat to the other side for external heat dissipation, the metal layers on two sides of the metal heat dissipation module are used to improve the heat dissipation efficiency, and meanwhile, the copper walls can improve the heat transfer efficiency between the first metal layer and the second metal layer. Moreover, a gap between the metal heat dissipation module and the side plate of the first opening frame is filled with the first dielectric layer, so that the metal heat dissipation module can be suitable for more opening frames, the process size does not need to be specially adjusted based on the size of the opening frame, effectively reducing the production cost of the metal heat dissipation module.

According to some embodiments of the present disclosure, the metal heat dissipation module further comprises: a thermal conductive dielectric layer, wherein the thermal conductive dielectric layer is filled in a thermal conductive groove of the metal heat dissipation module, the thermal conductive groove is a groove with a single-side opening formed by the first metal layer, the second metal layer and the copper wall, and an edge of the thermal conductive dielectric layer is aligned with an edge of the first metal layer.

According to some embodiments of the present disclosure, a plurality of copper columns are provided on inner side surfaces of the first metal layer and/or the second metal layer.

According to some embodiments of the present disclosure, the package carrier plate with an embedded efficient heat dissipation module further comprises: a chip; and a metal carrier, wherein a side surface of the metal carrier is attached to a back surface of the chip, and the other side surface of the metal carrier is attached to the metal heat dissipation module and the metal carrier plate.

According to some embodiments of the present disclosure, when the metal carrier has a width that is less than or equal to that of the first opening frame, one end of the metal carrier is attached to the metal heat dissipation module, and the other end of the metal carrier is attached to the metal carrier plate; or when the metal carrier has a width that is greater than that of the first opening frame, two ends of the metal carrier are attached to the metal carrier plate and cover an outer side of the first opening frame.

According to some embodiments of the present disclosure, the metal carrier plate is further provided with a second opening frame, and the second opening frame is filled with a second dielectric layer.

According to some embodiments of the present disclosure, a third dielectric layer is further laminated on outer sides of the metal carrier plate, the metal heat dissipation module and the chip, the third dielectric layer is provided with a through hole, at least one first blind hole and at least one second blind hole, an inner side of the first blind hole is communicated with a front surface of the chip, an inner side of the second blind hole is communicated with a surface of the metal carrier plate, and the through hole extends through the second opening frame.

According to some embodiments of the present disclosure, the package carrier plate with an embedded efficient heat dissipation module further comprises: a first metal pattern, wherein the first metal pattern is connected to a front surface of the chip through the first blind hole and extends to an outer side of the third dielectric layer; a second metal pattern, wherein the second metal pattern is connected to an outer side surface of the metal heat dissipation module through the second blind hole and extends to the outer side of the third dielectric layer; and a third metal pattern, wherein the third metal pattern extends to two side surfaces of the third dielectric layer through the through hole.

In a second aspect, an embodiment of the present disclosure further provides a manufacturing method for a package carrier plate with an embedded efficient heat dissipation module, comprising: preparing a plurality of parallel copper walls on a first metal layer, and laminating a phase change material in a cavity formed by two adjacent copper walls; electroplating metal on upper surfaces of the copper walls to obtain a second metal layer; preparing a metal carrier plate with a first opening frame, embedding a metal heat dissipation module into the first opening frame, laminating a substrate dielectric material between the metal heat dissipation module and a side wall of the first opening frame to obtain a first dielectric layer, and grinding the first dielectric layer to expose the metal carrier plate and the metal heat dissipation module; and performing build-up process to obtain the package carrier plate.

The manufacturing method for a package carrier plate with an embedded efficient heat dissipation module according to the embodiment of the present disclosure at least has the following beneficial effects. Firstly, a metal heat dissipation module is arranged in a first opening frame of a metal carrier plate, so that the characteristic of quick heat dissipation of metal can be used to improve the heat transfer effect and improve the internal heat dissipation efficiency of the package carrier plate. Secondly, a cavity is formed between the copper walls in the metal heat dissipation module, and a phase change material is filled in the cavity, so that the phase change material can be used to quickly absorb heat transferred by one of the first metal layer and the second metal layer and transfer the heat to the other side for external heat dissipation, the metal layers on two sides of the metal heat dissipation module are used to improve the heat dissipation efficiency, and meanwhile, the copper walls can improve the heat transfer efficiency between the first metal layer and the second metal layer. Moreover, a gap between the metal heat dissipation module and the side plate of the first opening frame is filled with the first dielectric layer, so that the metal heat dissipation module can be suitable for more opening frames, the process size does not need to be specially adjusted based on the size of the opening frame, effectively reducing the production cost of the metal heat dissipation module.

According to some embodiments of the present disclosure, before the laminating a phase change material in a cavity formed by two adjacent copper walls, the method further comprises: preparing a plurality of copper columns on the first metal layer.

According to some embodiments of the present disclosure, before the electroplating metal on upper surfaces of the copper walls to obtain a second metal layer, the method further comprises: laminating a high thermal conductive dielectric material in an area outside a cavity on the first metal layer to form a thermal conductive dielectric layer, and aligning an edge of the thermal conductive dielectric layer with an edge of the first metal layer through a grinding process.

According to some embodiments of the present disclosure, the metal carrier plate further comprises a second opening frame, and the laminating a substrate dielectric material between the metal heat dissipation module and a side wall of the first opening frame to obtain a first dielectric layer, and grinding the first dielectric layer to expose the metal carrier plate and the metal heat dissipation module comprises: laminating a substrate dielectric material in the metal heat dissipation module and the metal carrier plate, forming a first dielectric layer between the metal heat dissipation module and the side wall of the first opening frame, and forming a second dielectric layer in the second opening frame; and grinding the first dielectric layer and the second dielectric layer to expose the metal carrier plate and the metal heat dissipation module.

According to some embodiments of the present disclosure, the performing build-up process to obtain the package carrier plate comprises: arranging a first seed layer on surfaces of the metal heat dissipation module and the metal carrier plate, wherein when the first seed layer has a width that is less than that of the first opening frame, two ends of the first seed layer are respectively positioned on the metal heat dissipation module and the metal carrier plate, or when the first seed layer has a width that is greater than that of the first opening frame, two ends of the first seed layer are attached to the metal carrier plate and cover an outer side of the first opening frame; manufacturing a metal carrier on the first seed layer through a pattern electroplating process; and attaching a back surface of the chip to the metal carrier.

According to some embodiments of the present disclosure, after the attaching a back surface of the chip to the metal carrier, the method further comprises: laminating a substrate dielectric material on two sides of the metal heat dissipation module and the metal carrier plate to form a third dielectric layer; obtaining at least one first blind hole and at least one second blind hole by lasering the third dielectric layer, wherein an inner side of the first blind hole is communicated with a front surface of the chip, and an inner side of the second blind hole is communicated with a surface of the metal carrier plate; mechanically punching the third dielectric layer to obtain a through hole extending through the second opening frame; and arranging a second seed layer in the first blind hole, the second blind hole and the through hole, manufacturing a first metal pattern extending to an outer side of the third dielectric layer in the first blind hole, manufacturing a second metal pattern extending to the outer side of the third dielectric layer in the second blind hole, and manufacturing a third metal pattern extending to two side surfaces of the third dielectric layer through the through hole by using a pattern electroplating process.

DETAILED DESCRIPTION

Figure 1:
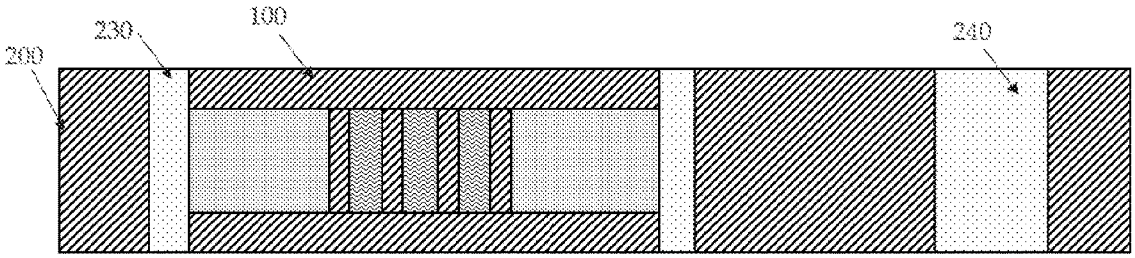
FIG. 1 is a schematic structural diagram of a package carrier plate with an embedded efficient heat dissipation module according to the teachings of the present disclosure.

Teachings of the present disclosure will be described in detail below, and examples of the teachings are shown in the accompanying drawings, wherein the same or similar reference numerals indicate the same or similar elements or elements having the same or similar functions throughout. The teachings described below with reference to the accompanying drawings are illustrative only for the purpose of explaining the present disclosure and are not to be construed as limiting the present disclosure.

In the description of the present disclosure, it should be understood that directional descriptions, for example, directions or positional relationships indicated by terms such as "upper", "lower", "front", "rear", "left", "right" and the like are based on the accompanying drawings, and are merely intended to facilitate and simplify the description of the present disclosure rather than indicate or imply that the indicated apparatus or element must have a specific direction and must be configured and operated according to the specific direction. Therefore, these directions or positional relationships should not be construed as limiting the present disclosure.

In the description of the present disclosure, "several" means one or more, "a plurality of" means two or more, "greater than", "less than", "more than" and the like are understood as excluding the following number, and "above", "below", "within" and the like are understood as including the following number. The description of "first" and "second" is merely for the purpose of distinguishing technical features, but shall not be understood as an indication or implication of relative importance, or an implicit indication of a quantity of indicated technical features, or an implicit indication of the sequence of the indicated technical features.

In the description of the present disclosure, unless otherwise explicitly defined, terms such as "arrange", "mount", "connect" and the like should be understood in a broad sense, and those of ordinary skills in the art can reasonably determine the specific meanings of the above terms in the present disclosure in conjunction with the specific contents of the technical solutions.

Teachings of the present disclosure are further described below with reference to the accompanying drawing.

As shown in FIG. 1, FIG. 1 is a schematic diagram of a package carrier plate with an embedded efficient heat dissipation module 100 according to the teachings of the present disclosure. The package carrier plate with an embedded efficient heat dissipation module comprises: a metal carrier plate 200, in which a first opening frame 210 is provided; and a metal heat dissipation module 100.

The metal heat dissipation module 100 comprises a first metal layer 110 and a second metal layer 150. A plurality of copper walls 120 arranged in parallel are connected between the first metal layer 110 and the second metal layer 150. A phase change material 130 is filled in a cavity formed between every two adjacent copper walls 120. The metal heat dissipation module 100 is embedded in the first opening frame 210. A first dielectric layer 230 is filled in a gap between the metal heat dissipation module 100 and an inner side wall of the first opening frame 210.

It should be noted that the metal carrier plate 200 may be a carrier plate made of a metal material and provided with a plurality of opening frames.

Figure 5:
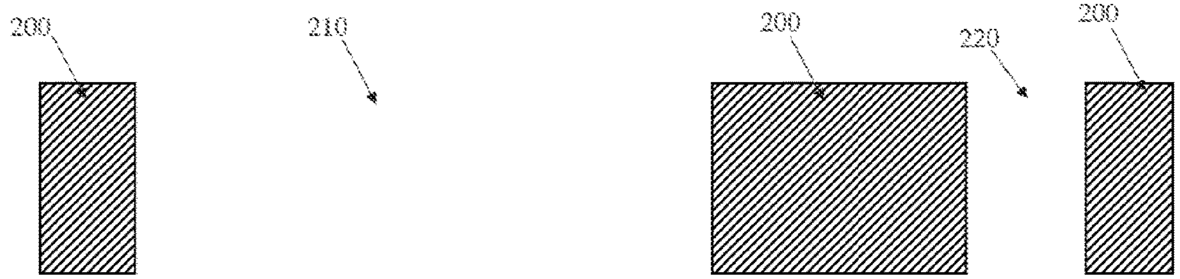
FIG. 5 is a schematic structural diagram of a metal carrier plate according to the teachings of the present disclosure.

Referring to FIG. 5, the metal carrier plate 200 may be provided with any number of first opening frames 210. Each first opening frame 210 is an opening frame for mounting a chip 300. The number of the first opening frames 210 is determined based on actual setting requirements of the chips 300. The number of the chips 300 arranged in each first opening frame 210 is not limited.

Figure 7:
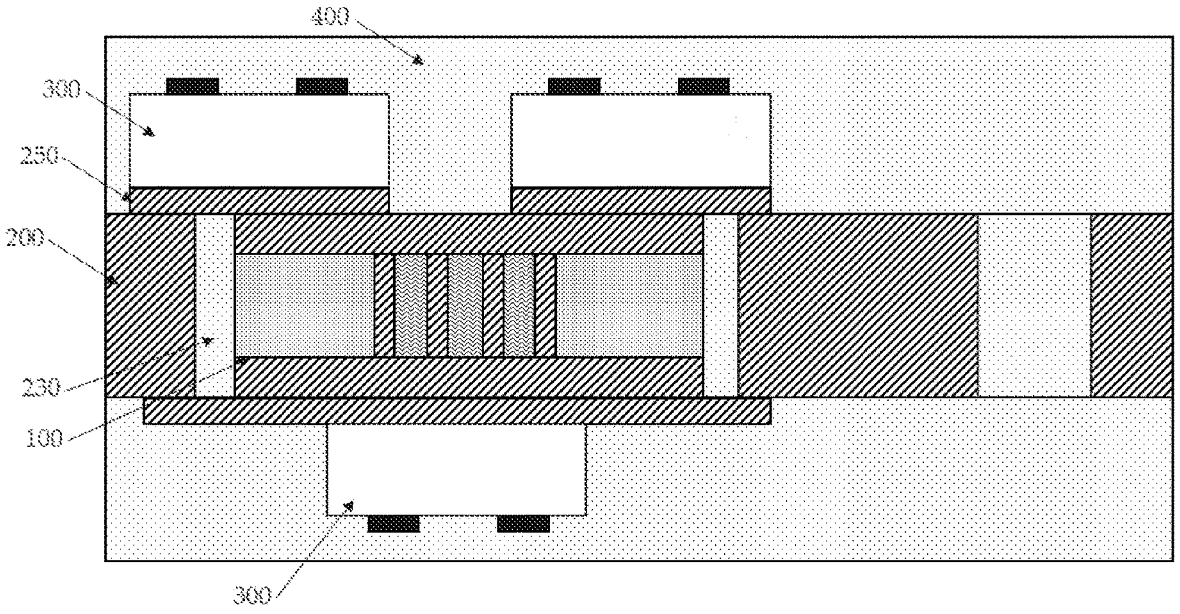
FIG. 7 is a schematic diagram after a chip is mounted and a dielectric layer is laminated according to the teachings of the present disclosure.

As shown in FIG. 7, the upper side of the first opening frame 210 is provided with two chips 300. The lower side of the first opening frame is provided with one chip 300. The bottom surface of the chip 300 overlaps the position of the metal heat dissipation module 100. The heat generated during the operation of the chip 300 is absorbed by the metal heat dissipation module 100, and is conducted to the outside through the metal material, thereby effectively improving the heat dissipation efficiency.

It should be noted that the metal in this example may be copper, and the metal copper has a good heat conduction effect and can also effectively control the material cost. Of course, other metals capable of conducting heat may also be used based on actual requirements. Details are not described in the following again.

It should be noted that one metal heat dissipation module 100 is embedded in each first opening frame 210. When the size of the metal heat dissipation module 100 matches the first opening frame 210, that is, there is no gap after embedding, the first dielectric layer 230 can be omitted. When the size of the metal heat dissipation module 100 is smaller than that of the first opening frame 210, the first dielectric layer 230 is laminated between an inner side wall of the first opening frame 210 and the metal heat dissipation module 100 in this example, the first dielectric layer 230 may be a common substrate dielectric material, and the gap between the metal heat dissipation module 100 and the first opening frame 210 may be filled by simple lamination and grinding without manufacturing the metal heat dissipation module 100 with a corresponding size for the first opening frames 210 with different sizes, so that the application range of the metal heat dissipation module 100 with a standard version size is increased, the production cost is effectively reduced, and the production efficiency is increased. It may be understood that, after the first dielectric layer 230 is obtained by filling the substrate dielectric material, the surfaces of the metal heat dissipation module 100 and the metal carrier plate 200 can be exposed through a grinding process and the like, so as to avoid affecting heat dissipation.

It should be noted that the first metal layer 110 is parallel to the second metal layer 150, and the copper walls 120 are connected between the first metal layer 110 and the second metal layer 150. During production, after the copper walls 120 are prepared on the first metal layer 110, the second metal layer 150 is obtained by electroplating on the upper surfaces of the copper walls 120. The two ends of each of the copper walls 120 are respectively connected to the first metal layer 110 and the second metal layer 150, so that heat of the first metal layer 110 can be conducted to the second metal layer 150, or the heat of the second metal layer 150 can be conducted to the first metal layer 110, and the heat dissipation efficiency can be improved when two sides of the metal heat dissipation module 100 are heated unevenly. For example, the first metal layer 110 is not provided with the chip 300, the second metal layer 150 is provided with the chip 300, therefore more heat is conducted into the second metal layer 150 in the operation process, while the first metal layer 110 has a low temperature. In this case, heat of the second metal layer 150 can be conducted to the first metal layer 110 through the copper walls 120, and the heat can be dissipated out through the first metal layer 110 and the second metal layer 150 simultaneously, so that the heat dissipation efficiency can be improved.

It should be noted that since the copper walls 120 are connected to the first metal layer 110 and the second metal layer 150, and a sealed cavity is formed inside the metal heat dissipation module 100, in this example, the phase change material 130 is filled in the cavity, and with the characteristic that the phase change material 130 absorbs heat quickly, the heat of the first metal layer 110 and the second metal layer 150 can be absorbed quickly, so that the first metal layer 110 and the second metal layer 150 can be maintained in a low temperature state, and the separate heat conduction efficiency of the two layers can be improved. Meanwhile, the secondary distribution of the heat in the metal heat dissipation module 100 can be accelerated, and the metal heat dissipation module 100 is fully used to perform overall heat dissipation. For example, continuing with the above example, the first metal layer 110 is not provided with the chip 300, the second metal layer 150 is provided with the chip 300, so that the second metal layer 150 has a high temperature. When using the copper walls 120 to conduct heat to the first metal layer 110, the phase change material 130 absorbs the heat of the second metal layer 150, so that the second metal layer 150 is cooled quickly, and the heat generated by the operation of the chip 300 is conducted better. Further, since the phase change material 130 is filled in the cavity, that is, the phase change material 130 is in direct contact with the surfaces of the copper walls 120, which have a large area, and the absorbed heat can be conducted to the first metal layer 110 with a lower temperature through the surfaces with a large area more quickly, so that the overall heat conduction efficiency of the metal heat dissipation module 100 can be effectively improved.

It may be understood that the phase change material 130 may be an organic phase change material 130 or an inorganic metal alloy material. After the copper walls 120 are manufactured on the first metal layer 110, if the phase change material 130 that is in a liquid phase at room temperature is used, it is necessary to punch a liquid injection hole in the second metal layer 150 during manufacturing after the second metal layer 150 is electroplated, which is complicated in manufacturing process, and the punching may affect the sealing performance and reliability of the second metal layer 150. Therefore, the phase change material 130 in this example may be in a solid phase at room temperature, and may change into a phase change material 130 that is in a liquid phase or a gas phase after being heated. After the copper walls 120 are manufactured on the first metal layer 110, the phase change material 130 that is in a solid phase at room temperature is laminated into the cavity, and then the second metal layer 150 is further electroplated, so that the manufacturing process can be simplified.

Figure 2:
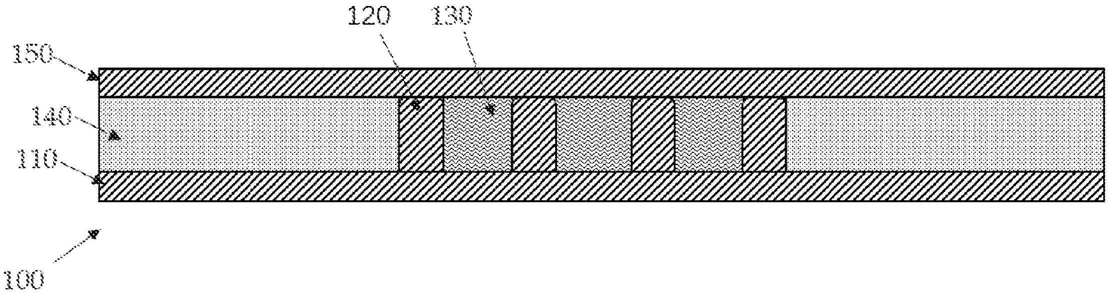
FIG. 2 is a schematic structural diagram of a metal heat dissipation module according to the teachings of the present disclosure.

In addition, in an example, referring to FIG. 2, the metal heat dissipation module 100 further comprises: a thermal conductive dielectric layer 140, wherein the thermal conductive dielectric layer 140 is filled in a thermal conductive groove of the metal heat dissipation module 100, the thermal conductive groove is a groove with a single-side opening formed by the first metal layer 110, the second metal layer 150 and the copper wall 120, and an edge of the thermal conductive dielectric layer 140 is aligned with an edge of the first metal layer 110.

Figure 3:
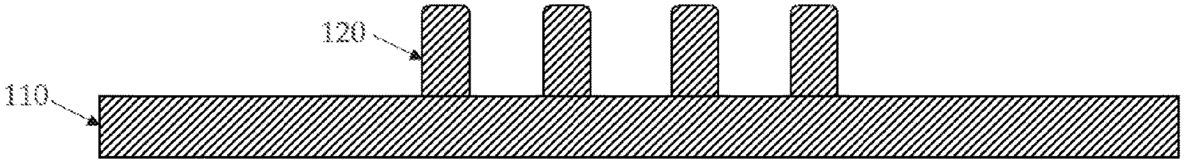
FIG. 3 is a schematic diagram of a first metal layer and a copper wall according to the teachings of the present disclosure.

It should be noted that the copper walls 120 arranged in parallel are connected between the first metal layer 110 and the second metal layer 150, and a cavity can be formed between two adjacent copper walls 120, wherein an outermost copper wall 120 may not be aligned with edges of the first metal layer 110 and the second metal layer 150. As shown in FIGS. 2 and 3, leftmost and rightmost copper walls 120 form a groove with a single-side opening between the first metal layer 110 and the second metal layer 150. Since the groove is not a closed space, if the phase change material 130 is arranged, it will cause the loss of the phase change material 130 when it is liquefied or gasified due to heat absorption. Therefore, in this example, the thermal conductive dielectric layer is filled in the groove to form the thermal conductive dielectric layer 140, the heat conduction among the copper walls 120, the first metal layer 110 and the second metal layer 150 is accelerated by the thermal conductive dielectric layer 140. For specific effects, reference may be made to the description of the phase change material 130 in the above example. Details are not described herein again.

Figure 4:
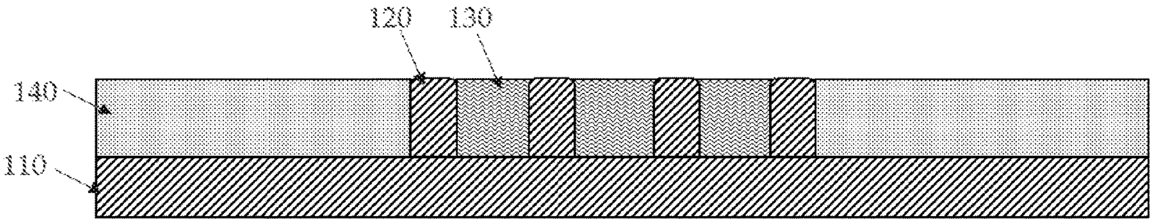
FIG. 4 is a schematic diagram of a laminated phase change material and a thermal conductive dielectric layer according to the teachings of the present disclosure.

Notably, since the second metal layer 150 is electroplated on upper sides of the copper walls 120 during the production process, referring to FIG. 4, when the phase change material 130 is laminated in the cavity, the thermal conductive dielectric layer can be laminated on two sides to form the thermal conductive dielectric layer 140, and the second metal layer 150 is electroplated after the aligned edges are ground.

In addition, in the teachings, a plurality of copper columns may be provided on inner side surfaces of the first metal layer and/or the second metal layer.

It should be noted that the difference between the copper column and the copper wall is that the copper column is only connected to the first metal layer or the second metal layer, which does not form a sealed area. In this example, by arranging the copper columns, the surface areas of the first metal layer and the second metal layer can be increased, thereby increasing the heat conduction effect.

It should be noted that the copper columns may be arranged inside the cavity to improve the heat conduction efficiency absorbed by the phase change material 130, or may be arranged outside the cavity to improve the heat conduction efficiency by increasing the surface areas of the first metal layer 110 and the second metal layer 150.

Figure 6:
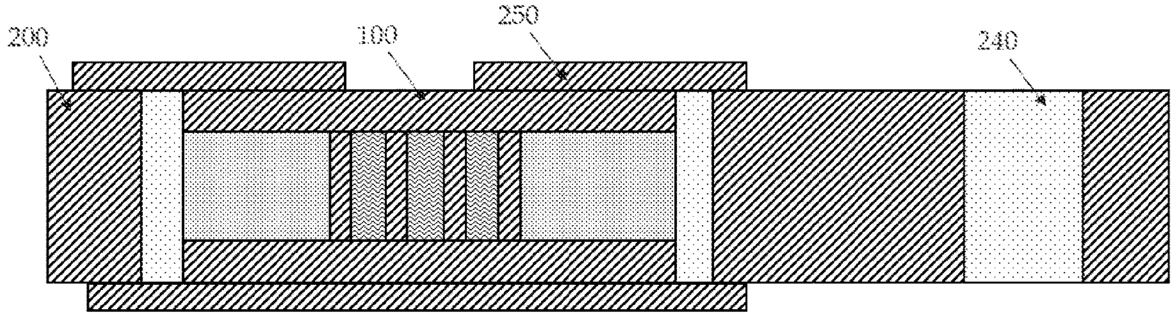
FIG. 6 is a schematic diagram after a metal carrier is manufactured according to the teachings of the present disclosure.

In addition, in an example, referring to FIGS. 6 and 7, the package carrier plate with an embedded efficient heat dissipation module may further comprise: a chip 300; and a metal carrier 250, wherein a side surface of the metal carrier 250 is attached to a back surface of the chip 300, and the other side surface is attached to the metal heat dissipation module 100 and the metal carrier plate 200.

It should be noted that components are generally arranged on a front surface of the chip 300, and therefore the front surface has a flatness that is lower than that of a back surface. In this example, a back surface of the chip 300 is attached to the metal carrier 250, the metal carrier 250 can quickly conduct the heat from the back surface of the chip 300. Meanwhile, the metal carrier 250 is attached to the metal heat dissipation module 100 and the metal carrier plate 200, so that the heat is quickly conducted to the outside, and the internal heat conduction effect of the package carrier plate is improved.

It should be noted that a surface of the metal carrier 250 contacts both the metal heat dissipation module 100 and the metal carrier plate 200. In a case that the metal heat dissipation module 100 and the metal carrier plate 200 are not in direct contact with each other due to the first dielectric layer 230 filled therebetween, the metal carrier 250 is used as a medium for heat conduction between the metal heat dissipation module 100 and the metal carrier plate 200. In a case that the metal heat dissipation module 100 absorbs heat quickly, the heat is conducted to the metal carrier plate 200 through the metal carrier 250 and then conducted to the outside, so that a conductive path of heat is effectively increased, and a heat dissipation effect is improved.

For example, referring to FIG. 7, the heat generated by the operation of the chip 300 is transferred to the metal carrier 250 through the back surface, the metal carrier 250 transfers the heat to the metal heat dissipation module 100 and the metal carrier plate 200. While the metal carrier plate 200 dissipates the heat transferred by the metal carrier 250 to the outside, the first metal layer 110 and the second metal layer 150 of the metal heat dissipation module 100 quickly absorb the heat transferred by the metal carrier 250 through the principle described in the above example, and transfer the heat to the metal carrier plate 200 through other metal carriers 250 with a lower temperature, so that a heat conduction path is increased, and a heat dissipation effect is improved.

It should be noted that, in this example, the number of the metal carriers 250 and the chips 300 is not limited, and each metal carrier 250 may be mounted with one or more chips 300 when the size of the metal carrier allows. The specific deployment manner may be determined based on the actual mounting requirements of the chips 300.

In addition, in an example, referring to FIGS. 6 and 7, when the metal carrier 250 has a width that is less than or equal to that of the first opening frame 210, one end of the metal carrier 250 is attached to the metal heat dissipation module 100, and the other end is attached to the metal carrier plate 200. Alternatively, when the metal carrier 250 has a width that is greater than that of the first opening frame 210, two ends of the metal carrier 250 are attached to the metal carrier plate 200 and cover an outer side of the first opening frame 210.

For example, referring to FIG. 6, a width of the metal carrier 250 at the upper side is less than that of the first opening frame 210. In order to contact both the metal heat dissipation module 100 and the metal carrier plate 200, the metal carrier 250 may be arranged between the metal carrier plate 200 and the metal heat dissipation module 100, so as to ensure the heat dissipation effect.

For example, referring to FIG. 6, a width of the metal carrier 250 at the lower side is greater than that of the first opening frame 210, and the metal carrier 250 extends across two ends of the first opening frame 210 and covers the outer side of the metal heat dissipation module 100, so that the heat of the metal heat dissipation module 100 can be transferred to the metal carrier plate 200 through the metal carrier 250, thereby improving the heat dissipation efficiency.

In addition, in an example, referring to FIGS. 5 and 6, the metal carrier plate 200 may be further provided with a second opening frame 220. The second opening frame 220 is filled with a second dielectric layer 240.

It should be noted that the second opening frame 220 is an opening frame that is not provided with the chip 300, and the second opening frame 220 may be filled with a substrate dielectric material that is the same as the first dielectric layer 230, and then laminated and ground to form the second dielectric layer 240, so as to provide a structural basis for providing a metal pattern on the metal carrier plate 200.

Figure 8:
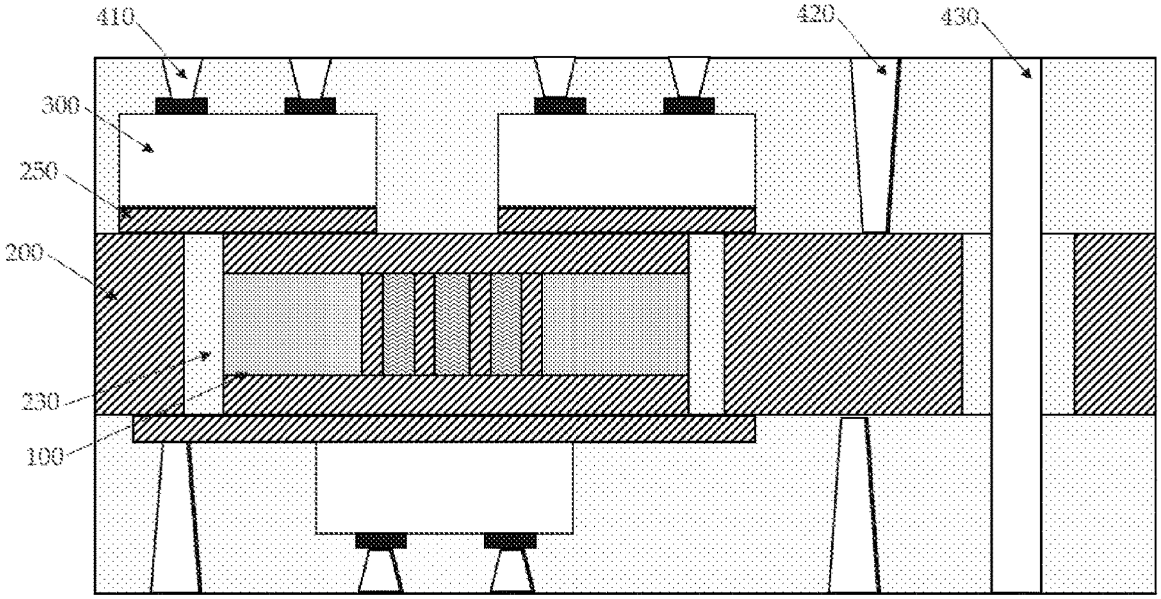
FIG. 8 is a schematic diagram of punching a third dielectric layer according to the teachings of the present disclosure.

In addition, in an example, referring to FIG. 8, a third dielectric layer 400 is further laminated on outer sides of the metal carrier plate 200, the metal heat dissipation module 100 and the chip 300, the third dielectric layer 400 is provided with a through hole 430, at least one first blind hole 410 and at least one second blind hole 420, an inner side of the first blind hole 410 is communicated with a front surface of the chip 300, an inner side of the second blind hole 420 is communicated with a surface of the metal carrier plate 200, and the through hole 430 extends through the second opening frame 220.

It should be noted that, in order to package the metal carrier plate 200, after the structure shown in FIG. 6 is obtained, that is, after the metal heat dissipation module 100 is embedded in the metal carrier plate 200, and the metal carrier 250 and the chip 300 are provided, a substrate dielectric material is laminated on two sides of the structure to form a third dielectric layer 400, so as to package the metal carrier plate 200. The third dielectric layer 400, the first dielectric layer 230, and the second dielectric layer 240 may be made of the same material, which may be selected based on actual requirements.

It should be noted that the first blind hole 410 and the second blind hole 420 may be obtained by lasering the third dielectric layer 400, and the through hole 430 may be obtained by mechanically punching. As shown in FIG. 8, the position of the first blind hole 410 may correspond to a component on the front surface of the chip 300, and the position of the second blind hole 420 may correspond to the position of the metal carrier plate 200, which can provide a structural basis for the electroplated metal pattern to dissipate heat to the outside.

It should be noted that the through hole 430 is provided at a position corresponding to the second opening frame 220, which can provide a structural basis for electrical connection between two layers of the package carrier plate. If there is no requirement on the electrical connection, the through hole 430 may not be provided. This is not limited in this example.

Figure 9:
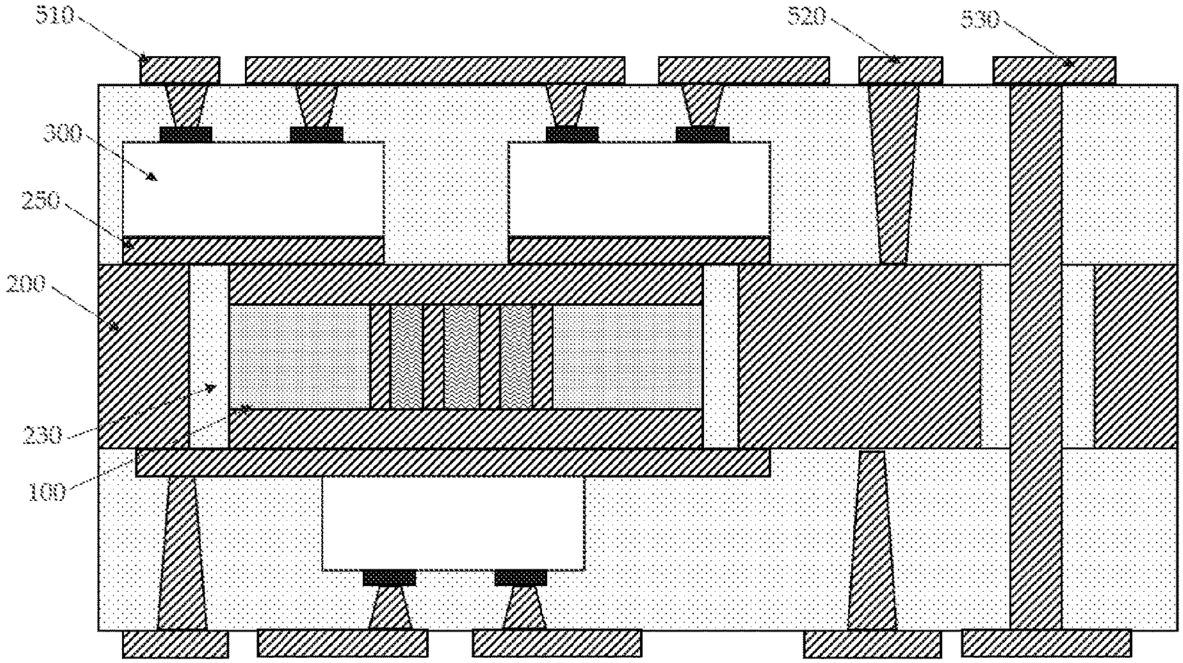
FIG. 9 is a schematic structural diagram of a package carrier plate according to the teachings of the present disclosure.

In addition, in an example, referring to FIG. 9, the package carrier plate with an embedded efficient heat dissipation module further comprises: a first metal pattern 510, wherein the first metal pattern 510 is connected to a front surface of the chip 300 through the first blind hole 410 and extends to an outer side of the third dielectric layer 400; a second metal pattern 520, wherein the second metal pattern 520 is connected to an outer side surface of the metal heat dissipation module 100 through the second blind hole 420 and extends to the outer side of the third dielectric layer 400; and a third metal pattern 530, wherein the third metal pattern

530 extends to two side surfaces of the third dielectric layer 400 through the through hole 430.

It should be noted that, as shown in FIG. 9, the first metal pattern 510 of the first blind hole 410 extends from the front surface of the chip 300 to the outer side of the third dielectric layer 400, and the heat of the component on the front surface of the chip 300 can be dissipated to the outside through the first metal pattern 510. The second metal pattern 520 of the second blind hole 420 extends from the metal carrier plate 200 to the outside, and in the above example, it is illustrated that the heat generated by the chip 300 is transferred to the metal carrier plate 200 through the metal carrier 250 and the metal heat dissipation module 100, and then the heat of the metal carrier plate 200 can be transferred to the outside through the second metal pattern 520. Through the first metal pattern 510 and the second metal pattern 520, in a case that the package carrier plate improves the internal heat conduction efficiency, the internal heat is quickly conducted and dissipated to the outside through the first metal pattern 510 and the second metal pattern 520, and the heat dissipation effect of the package carrier plate is improved.

It should be noted that the third metal pattern 530 extends to the two side surfaces of the third dielectric layer 400 through the through hole 430, so that metal portions can be formed on two sides of the third dielectric layer 400, and a basis for electrical connection is provided for the circuit structures on two sides of the package carrier plate.

Figure 10:
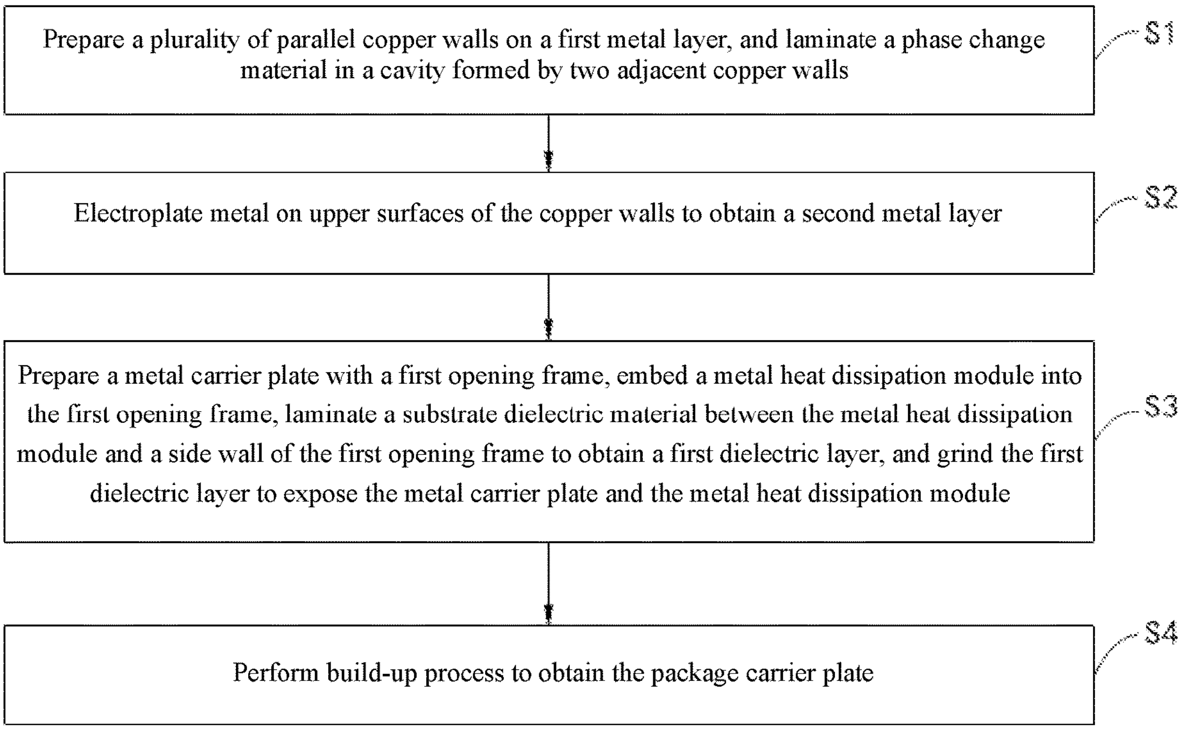
FIG. 10 is a flowchart of a manufacturing method for a package carrier plate with an embedded efficient heat dissipation module according to the teachings of the present disclosure.

In addition, referring to FIG. 10, FIG. 10 is a flowchart of a manufacturing method for a package carrier plate with an embedded efficient heat dissipation module, where the manufacturing method for a package carrier plate with an embedded efficient heat dissipation module according to an example of the present disclosure includes but is not limited to the following steps:

- step S1: preparing a plurality of parallel copper walls on a first metal layer, and laminating a phase change material in a cavity formed by two adjacent copper walls;
- step S2: electroplating metal on upper surfaces of the copper walls to obtain a second metal layer;
- step S3: preparing a metal carrier plate with a first opening frame, embedding a metal heat dissipation module into the first opening frame, laminating a substrate dielectric material between the metal heat dissipation module and a side wall of the first opening frame to obtain a first dielectric layer, and grinding the first dielectric layer to expose the metal carrier plate and the metal heat dissipation module; and
- step S4: performing build-up process to obtain the package carrier plate.

It should be noted that the width and the thickness of the first metal layer 110 may be selected based on actual requirements, which is not limited in this example. After the first metal layer 110 is prepared, the copper walls 120 may be prepared on the upper side of the first metal layer 110 by electroplating and the like to obtain the structure shown in FIG. 3. The solid phase change material 130 is laminated between two adjacent copper walls 120, a volume of the cavity may be calculated based on a distance between the copper walls 120, and then the phase change material 130 with the corresponding volume is placed and laminated to obtain the structure shown in FIG. 4, so that the phase change material 130 can be saved, the time required for grinding after laminating can be reduced, and the construction efficiency can be improved.

It should be noted that, in a case that the laminated phase change material 130 ensures that the upper surfaces of the copper walls 120 are flush, the second metal layer 150 may be electroplated on the upper surfaces of the copper walls 120, so as to obtain the metal heat dissipation module 100, and the heat dissipation effect and principle of the metal heat dissipation module 100 may refer to the description of the above structure example. Details are not described herein again.

It should be noted that, referring to FIG. 5, the structure of the metal carrier plate 200 with the first opening frame 210 is shown, the number and size of the first opening frame 210 can be adjusted based on the requirements for mounting of the chip 300. After the metal heat dissipation module 100 is embedded in the first opening frame 210, a substrate dielectric material is laminated in a gap between the first opening frame 210 and the metal heat dissipation module 100, which is then ground to expose the metal heat dissipation module 100 and the metal carrier plate 200, thereby forming a first dielectric layer 230.

It should be noted that the build-up process may be performed based on the requirement of the package carrier plate, for example, as shown in FIG. 7, a metal carrier 250, a third dielectric layer 400 and a metal pattern are built on the metal carrier plate 200 and the metal heat dissipation module 100. This is not limited in this example.

In addition, before performing the step S1 of laminating a phase change material in a cavity formed by two adjacent copper walls, the method may further include but is not limited to the following steps:

- step S11: preparing a plurality of copper columns on the first metal layer.

It should be noted that the copper columns may be prepared on the first metal layer 110 by electroplating, and the distribution area and the effect of the copper columns may refer to the description of the above structure example. Details are not described herein again.

It should be noted that, when the second metal layer is obtained by electroplating, if the copper columns need to be prepared in the second metal layer, slots may also be dug in the phase change material, and the copper columns connected to the second metal layer is formed in the respective slots during electroplating.

In addition, before performing the step S2, the method may further include but is not limited to the following step:

- step S12: laminating a high thermal conductive dielectric material in an area outside a cavity on the first metal layer to form a thermal conductive dielectric layer, and aligning an edge of the thermal conductive dielectric layer with an edge of the first metal layer through a grinding process.

It should be noted that, referring to FIG. 3, after the copper walls 120 are prepared on the first metal layer 110, the phase change material 130 is laminated between the adjacent copper walls 120, and the high thermal conductive dielectric material is laminated on the outer sides of the leftmost and rightmost copper walls 120 to form the thermal conductive dielectric layer 140, and the obtained structure is as shown in FIG. 4. After laminating, the thermal conductive dielectric layer 140 is ground to be flush with the copper walls 120 and the phase change material 130, so as to ensure that the surface of the electroplated second metal layer 150 is flat.

In addition, the metal carrier plate 200 may further comprises a second opening frame 220, and the step S3 further includes but is not limited to the following steps:

- step S31: laminating a substrate dielectric material in the metal heat dissipation module and the metal carrier plate, forming a first dielectric layer between the metal heat dissipation module and the side wall of the first opening frame, and forming a second dielectric layer in the second opening frame; and step S32: grinding the first dielectric layer and the second dielectric layer to expose the metal carrier plate and the metal heat dissipation module.

It should be noted that the structure of the metal carrier plate 200 is shown in FIG. 5 and comprises a first opening frame 210 and a second opening frame 220. After the metal heat dissipation module 100 is embedded into the first opening frame 210, the same substrate dielectric material may be laminated at the same time, and the first dielectric layer 230 is formed after being ground. A second dielectric layer 240 is formed in the second opening frame 220, and the functions of the first dielectric layer 230 and the second dielectric layer 240 may refer to the description of the above examples. Details are not described herein again.

In addition, the step S4 may further include but is not limited to the following steps:

step S41: arranging a first seed layer on surfaces of the metal heat dissipation module and the metal carrier plate, wherein when the first seed layer has a width that is less than that of the first opening frame, two ends of the first seed layer are respectively positioned on the metal heat dissipation module and the metal carrier plate, or when the first seed layer has a width that is greater than that of the first opening frame, two ends of the first seed layer are attached to the metal carrier plate and cover an outer side of the first opening frame;

step S42: manufacturing a metal carrier on the first seed layer through a pattern electroplating process; and step S43: attaching a back surface of the chip to the metal carrier.

It should be noted that the metal carrier 250 is obtained by electroplating the first seed layer. Based on this, the arrangement manner and the size of the first seed layer may be adjusted based on the requirement of the metal carrier 250, the structure of the metal carrier 250 is obtained as shown in FIG. 6, and the function and the effect of the metal carrier 250 may refer to the description of the above structure example. Details are not described herein again.

It should be noted that after the metal carrier 250 is obtained through the first seed layer, the back surface of the chip 300 may be attached to the metal carrier 250 by heating or pressure application, and the structure shown in FIG. 7 is obtained after the substrate dielectric layer is laminated, and the function and effect of attaching the back surface of the chip 300 to the metal carrier 250 may refer to the description of the above examples. Details are not described herein again.

In addition, after the step S43, the method may further include but is not limited to the following steps:

step S44: laminating a substrate dielectric material on two sides of the metal heat dissipation module and the metal carrier plate to form a third dielectric layer;

step S45: obtaining at least one first blind hole and at least one second blind hole by lasering the third dielectric layer, wherein an inner side of the first blind hole 410 is communicated with a front surface of the chip, and an inner side of the second blind hole is communicated with a surface of the metal carrier plate;

step S46: mechanically punching the third dielectric layer to obtain a through hole extending through the second opening frame; and step S47: arranging a second seed layer in the first blind hole, the second blind hole and the through hole, manufacturing a first metal pattern extending to an outer side of the third dielectric layer in the first blind hole, manufacturing a second metal pattern extending to the outer side of the third dielectric layer in the second blind hole, and manufacturing a third metal pattern extending to two side surfaces of the third dielectric layer through the through hole by using a pattern electroplating process.

It should be noted that, after the chip 300 is mounted, a substrate dielectric material may be laminated on two sides to obtain a third dielectric layer 400, so as to obtain the structure shown in FIG. 7. In order to conduct internal heat to the outside, in this example, a first blind hole 410 is formed in a position corresponding to the front surface of the chip 300 by laser, a second blind hole 420 is formed in a position corresponding to the metal carrier plate 200, so as to obtain the structure shown in FIG. 8. A first metal pattern 510 and a second metal pattern 520 are obtained by providing a second seed layer and performing pattern electroplating, and specific functions and effects may refer to the description of the above structure example. Details are not described herein again.

It should be noted that the first blind hole 410 and the second blind hole 420 can be formed by laser because they do not extend through the package carrier plate, and the through hole 430 is used to manufacture the third metal pattern 530 for electrical connection, so that the through hole can be manufactured by mechanically punching for extending through the second dielectric layer 240 of the second opening frame 220, thereby providing a basis for electrical connection on two sides of the package carrier plate.

REFERENCE NUMBERS

100: metal heat dissipation module; 110: first metal layer; 120: copper wall; 130: phase change material; 140: thermal conductive dielectric layer; 150: second metal layer; 200: metal carrier plate; 210: first opening frame; 220: second opening frame; 230: first dielectric layer; 240: second dielectric layer; 250: metal carrier; 300: chip; 400: third dielectric layer; 410: first blind hole; 420: second blind hole; 430: through hole; 510: first metal pattern; 520: second metal pattern; 530: third metal pattern.

Other embodiments of the present disclosure will be apparent to those of ordinary skills in the art based on the specification and practice of the implementation disclosed herein. The present disclosure is intended to cover any variations, uses or adaptive changes of the present disclosure that follow the general principles of the present disclosure and comprise common general knowledge and conventional technical means in the art to which the present disclosure pertains and are not disclosed in the present disclosure.

It should be understood that the present disclosure is not limited to the precise arrangements that have been described above and shown in the drawings, and that various modifications and changes can be made without departing from the scope of the present disclosure. The scope of the present disclosure is limited only by the appended claims.

The foregoing describes the preferred embodiments of the present disclosure in detail, however, the present disclosure is not limited to the above embodiments. Those of ordinary skills in the art can make various equivalent changes or substitutions without departing from the gist of the present disclosure, and such equivalent changes or substitutions are all included in the scope defined by the claims of the present disclosure.

What is claimed is:

1. A package carrier plate with an embedded efficient heat dissipation module, comprising:
a) a metal carrier plate, in which a first opening frame is provided; and
b) a metal heat dissipation module, wherein the metal heat dissipation module comprises:
i) a first metal layer;
ii) a second metal layer,
iii) a plurality of copper walls arranged in parallel are connected between the first metal layer and the second metal layer,
iv) a phase change material is filled in a cavity formed between every two adjacent copper walls; and
wherein the metal heat dissipation module is embedded in the first opening frame; and
wherein a first dielectric layer is filled in a gap between the metal heat dissipation module and an inner side wall of the first opening frame.

2. The package carrier plate with the embedded efficient heat dissipation module according to claim 1, wherein the metal heat dissipation module further comprises:
a thermal conductive dielectric layer, wherein the thermal conductive dielectric layer is filled in a thermal conductive groove of the metal heat dissipation module;
wherein the thermal conductive groove is a groove with a single-side opening formed by the first metal layer, the second metal layer and the copper wall; and
wherein an edge of the thermal conductive dielectric layer is aligned with an edge of the first metal layer.

3. The package carrier plate with the embedded efficient heat dissipation module according to claim 1, wherein a plurality of copper columns are provided on inner side surfaces of the first metal layer and/or the second metal layer.

4. The package carrier plate with an embedded efficient heat dissipation module according to claim 1, further comprising:
(i) a chip; and
(ii) a metal carrier; and
wherein a side surface of the metal carrier is attached to a back surface of the chip, and the other side surface of the metal carrier is attached to the metal heat dissipation module and the metal carrier plate.

5. The package carrier plate with the embedded efficient heat dissipation module according to claim 4, wherein when the metal carrier has a width that is less than or equal to a width of the first opening frame, one end of the metal carrier is attached to the metal heat dissipation module, and the other end of the metal carrier is attached to the metal carrier plate; or
when the metal carrier has a width that is greater than a width of the first opening frame, two ends of the metal carrier are attached to the metal carrier plate and cover an outer side of the first opening frame.

6. The package carrier plate with the embedded efficient heat dissipation module according to claim 4, wherein the metal carrier plate is further provided with a second opening frame, and the second opening frame is filled with a second dielectric layer.

7. The package carrier plate with the embedded efficient heat dissipation module according to claim 6, wherein a third dielectric layer is further laminated on outer sides of the metal carrier plate, the metal heat dissipation module and the chip, the third dielectric layer is provided with a through hole, at least one first blind hole and at least one second blind hole, an inner side of the first blind hole is communicated with a front surface of the chip, an inner side of the second blind hole is communicated with a surface of the metal carrier plate, and the through hole extends through the second opening frame.

8. The package carrier plate with the embedded efficient heat dissipation module according to claim 7, further comprising:
(i) a first metal pattern, wherein the first metal pattern is connected to a front surface of the chip through the first blind hole and extends to an outer side of the third dielectric layer;
(ii) a second metal pattern, wherein the second metal pattern is connected to an outer side surface of the metal heat dissipation module through the second blind hole and extends to the outer side of the third dielectric layer; and
(iii) a third metal pattern, wherein the third metal pattern extends to two side surfaces of the third dielectric layer through the through hole.

9. A manufacturing method for a package carrier plate with an embedded efficient heat dissipation module, comprising:
a) preparing a plurality of parallel copper walls on a first metal layer, and laminating a phase change material in a cavity formed by two adjacent copper walls;
b) electroplating metal on upper surfaces of the copper walls to obtain a second metal layer;
c) preparing a metal carrier plate with a first opening frame, embedding a metal heat dissipation module into the first opening frame, laminating a substrate dielectric material between the metal heat dissipation module and a side wall of the first opening frame to obtain a first dielectric layer, and grinding the first dielectric layer to expose the metal carrier plate and the metal heat dissipation module; and
d) performing a build-up process to obtain the package carrier plate.

10. The manufacturing method according to claim 9, wherein before the laminating the phase change material in the cavity formed by the two adjacent copper walls, the method further comprises:
preparing a plurality of copper columns on the first metal layer.

11. The manufacturing method according to claim 9, wherein before the electroplating the metal on upper surfaces of the copper walls to obtain a second metal layer, the method further comprises:
laminating a high thermal conductive dielectric material in an area outside a cavity on the first metal layer to form a thermal conductive dielectric layer, and aligning an edge of the thermal conductive dielectric layer with an edge of the first metal layer through a grinding process.

12. The manufacturing method according to claim 9, wherein the metal carrier plate further comprises a second opening frame, and the laminating the substrate dielectric material between the metal heat dissipation module and the side wall of the first opening frame to obtain the first dielectric layer, and grinding the first dielectric layer to expose the metal carrier plate and the metal heat dissipation module comprises:
(i) laminating a substrate dielectric material in the metal heat dissipation module and the metal carrier plate, forming a first dielectric layer between the metal heat dissipation module and the side wall of the first opening frame, and forming a second dielectric layer in the second opening frame; and (ii) grinding the first dielectric layer and the second dielectric layer to expose the metal carrier plate and the metal heat dissipation module.

13. The manufacturing method according to claim 9, wherein the performing the build-up process to obtain the package carrier plate comprises:

(i) arranging a first seed layer on surfaces of the metal heat dissipation module and the metal carrier plate, wherein when the first seed layer has a width that is less than a width of the first opening frame, two ends of the first seed layer are respectively positioned on the metal heat dissipation module and the metal carrier plate, or when the first seed layer has a width that is greater than a width of the first opening frame, two ends of the first seed layer are attached to the metal carrier plate and cover an outer side of the first opening frame;

(ii) manufacturing a metal carrier on the first seed layer through a pattern electroplating process; and (iii) attaching a back surface of a chip to the metal carrier.

14. The manufacturing method according to claim 13, wherein after the attaching the back surface of the chip to the metal carrier, the method further comprises:

(iv) laminating a substrate dielectric material on two sides of the metal heat dissipation module and the metal carrier plate to form a third dielectric layer;

(v) obtaining at least one first blind hole and at least one second blind hole by lasering the third dielectric layer, wherein an inner side of the first blind hole is communicated with a front surface of the chip, and an inner side of the second blind hole is communicated with a surface of the metal carrier plate;

(vi) mechanically punching the third dielectric layer to obtain a through hole extending through the second opening frame; and (vii) arranging a second seed layer in the first blind hole, the second blind hole and the through hole, manufacturing a first metal pattern extending to an outer side of the third dielectric layer in the first blind hole, manufacturing a second metal pattern extending to the outer side of the third dielectric layer in the second blind hole, and manufacturing a third metal pattern extending to two side surfaces of the third dielectric layer through the through hole by using a pattern electroplating process.

* * * * *